(12) United States Patent
Klein et al.

(10) Patent No.: US 11,635,886 B2
(45) Date of Patent: Apr. 25, 2023

(54) AUDIO OUTPUT DEVICE

(71) Applicant: Kano Computing Limited, London (GB)

(72) Inventors: Alex Klein, London (GB); Bruno Schillinger, London (GB); James Hicks, London (GB)

(73) Assignee: Kano Computing Limited, London (GB)

( * ) Notice: Subject to any disclaimer, the term of this patent is extended or adjusted under 35 U.S.C. 154(b) by 127 days.

(21) Appl. No.: 17/210,989

(22) Filed: Mar. 24, 2021

(65) Prior Publication Data
US 2021/0303120 A1  Sep. 30, 2021

(30) Foreign Application Priority Data
Mar. 24, 2020  (GB) ..................... 2004277

(51) Int. Cl.
| | | |
|---|---|---|
| *G06F 3/0488* | (2022.01) | |
| *G06F 3/16* | (2006.01) | |
| *H04R 1/02* | (2006.01) | |
| *A63F 13/98* | (2014.01) | |
| *G11B 27/038* | (2006.01) | |

(Continued)

(52) U.S. Cl.
CPC ............ *G06F 3/0488* (2013.01); *G06F 3/165* (2013.01); *H04R 1/028* (2013.01); *A63F 13/98* (2014.09); *G10H 1/0008* (2013.01); *G11B 27/005* (2013.01); *G11B 27/038* (2013.01); *G11B 27/32* (2013.01); *H04H 60/04* (2013.01); *H04L 65/1069* (2013.01)

(58) Field of Classification Search
CPC ....... G06F 3/0488; G06F 3/165; H04R 1/028; A63F 13/98; G10H 1/0008; G11B 27/005; G11B 27/038; G11B 27/32; H04H 60/04; H04S 1/00; H04L 65/1069
See application file for complete search history.

(56) References Cited

U.S. PATENT DOCUMENTS

2006/0225554 A1 * 10/2006 Price ..................... G11B 27/034 84/1
2008/0272927 A1 * 11/2008 Woolley ................ G06F 3/0412 345/173

(Continued)

OTHER PUBLICATIONS

Orba, Orba Manual V1.8 (Year: 2020).*

(Continued)

*Primary Examiner* — Matthew A Eason
*Assistant Examiner* — Kuassi A Ganmavo
(74) *Attorney, Agent, or Firm* — Gerald T. Gray; Leydig, Voit & Mayer, LTD.

(57) ABSTRACT

An audio output device comprises a loudspeaker and, four stem control inputs substantially even spaced on the upper surface of a housing. The stem control inputs are each divided into four segments, each comprising a touch sensor and an illumination unit. Each stem control input is associated with a different stem in an audio track for playback via the loudspeaker. Touching the segments of each stem control input results in the touch being detected and a touch signal being output by the respective segment. In response to a touch signal, the associated illumination unit is togged on/off and a property of the associated stem is varied during playback by loudspeaker.

25 Claims, 5 Drawing Sheets

(51) Int. Cl.
*G10H 1/00* (2006.01)
*G11B 27/00* (2006.01)
*G11B 27/32* (2006.01)
*H04L 65/1069* (2022.01)
*H04H 60/04* (2008.01)

(56) References Cited

U.S. PATENT DOCUMENTS

| | | | | |
|---|---|---|---|---|
| 2010/0316247 | A1* | 12/2010 | Ding | G08B 7/066 |
| | | | | 381/397 |
| 2011/0193790 | A1* | 8/2011 | Lin | G06F 3/041 |
| | | | | 345/173 |
| 2013/0070948 | A1* | 3/2013 | Lee | H04M 1/035 |
| | | | | 381/334 |
| 2013/0239787 | A1* | 9/2013 | McMillen | G10H 1/34 |
| | | | | 84/601 |
| 2014/0267136 | A1* | 9/2014 | Phipps | G06F 3/0412 |
| | | | | 345/173 |
| 2015/0237290 | A1* | 8/2015 | Lee | H04N 5/45 |
| | | | | 348/570 |
| 2016/0035217 | A1* | 2/2016 | Camden | G05B 15/02 |
| | | | | 340/12.5 |
| 2019/0090328 | A1* | 3/2019 | Sakagami | A63J 5/02 |

OTHER PUBLICATIONS

Artiphon, Introducing Orba by Artiphon . . . , Youtube, (Year: 2019).*
Nl, Traktor Kontrol F1 Manual (Year: 2015).*

* cited by examiner

AUDIO OUTPUT DEVICE

CROSS-REFERENCES TO RELATED APPLICATIONS

This application claims priority to UK Patent Application No. 2004277.6, filed on Mar. 24, 2020, which is hereby incorporated by reference in its entirety.

TECHNICAL FIELD

The present invention relates generally to entertainment devices or devices used in or for entertainment. In particular, but not exclusively, the invention concerns audio output devices, including touch sensitive audio output devices.

BACKGROUND

It is common to provide audio output devices such as loudspeakers that may be connected to other consumer devices via a wired or wireless connection. The audio output devices can facilitate the playback of music or other audio content. In many instances, the audio devices comprise user actuable input means enabling control of volume, start/pausing of playback and/or track selection. Whilst such known devices facilitate simple playback very effectively, they are not adapted to provide more sophisticated functionality.

In audio production, a stem is a discrete or grouped collection of audio sources mixed together, usually by one person, to be dealt with downstream as one unit. A single stem may be delivered in mono, stereo, or in multiple tracks for surround sound. The provision of musical tracks in the form of a series of stems has become more popular in recent times. Using a mixing desk or virtual mixing desk running on a consumer device, a user can effectively remix the track as it plays. Nevertheless, implementing such control can be awkward on a portable device. This has thus discouraged the more widespread use of this functionality.

It is therefore an object of the present invention to provide an audio output device that at least partially overcomes or alleviates the above problems.

SUMMARY

According to a first aspect of the present invention there is provided an audio output device operable to provide audio playback of an audio track comprising one or more stems comprising: a loudspeaker operable to provide audio playback; and a plurality of stem control inputs, each stem control input associated with a stem, wherein each stem control input comprises multiple touch sensitive stem segments, each stem segment provided with a corresponding illumination element, and wherein each stem segment is operable in response to touch to output a touch signal, the touch signal operable to control: operation of the corresponding illumination element; and audio playback of the stem associated with said stem control input.

The present invention thus facilitates simple control of playback of musical stems and clear feedback to a user as to the control input.

The device may comprise any suitable number of stem control inputs. In one embodiment, the device may comprise, say, four stem control inputs. The skilled man will of course appreciate that the number of stem control inputs may be varied if necessary.

The audio output device may comprise a controller connected to the loudspeaker and the stem control inputs. The controller may be operable to control loudspeaker operation in response to the stem control inputs.

In one embodiment, the segments in each stem control input are provided in a linear array. Each stem control input may comprise any suitable number of segments. Typically, each stem control input will comprise the same number of segments. In one preferred embodiment, each stem control input may comprise, say, four segments. The skilled man will of course appreciate that the number of segments may be varied if necessary.

In one embodiment, each segment comprises a capacitive touch sensing circuit. The capacitive touch sensing circuit may be provided on a front face of a substrate. The corresponding illumination unit may be provided on a rear face of the substrate. The illumination unit may be an LED. The activation status of the corresponding illumination unit may be toggled in response to touch of the segment.

In some embodiments, the illumination unit may be operable to emit light of two or more different colours and/or at different intensities. In such embodiments, the toggling of activation status may include switching between different colours and/or intensities.

The substrate may be substantially transparent or translucent. This facilitates light from the illumination unit being transmitted though the substrate. Additionally, or alternatively the substrate may comprise a transparent or translucent aperture in the vicinity of the illumination unit. This facilitates the transmission of light through the substrate in a spatially limited area only. This can provide a relatively discrete light source for each segment.

The substrate may be a flexible substrate. This can facilitate the provision of control inputs on curved surfaces of the audio output device and/or on flexible surfaces of the audio output device.

In response to touch of a stem control input, playback of the associated stem may be started, stopped, paused or resumed, as appropriate. Additionally or alternatively, in response to touch of a stem control input, other stem properties including but not limited to: playback volume of the associated stem, playback speed of the associated stem, looping of all or part of the associated stem, isolation of the associated stem or other such stem properties may be varied.

In some embodiments multiple stems may be associated with a single stem control input. In such embodiments, in response to a touch, each associated stem is controlled in the same manner. Alternatively, the control input may be operable to enable selection of an associated stem for control.

In some embodiments, each stem control input may comprise a primary segment and a plurality of secondary segments. In such embodiments, touch of the primary segment may control a first stem playback property and touch of the secondary segments may control a secondary playback property. In some such embodiments, the output of touch signals and/or control of audio playback and/or the corresponding illumination unit may be enabled or disabled for secondary segments in response to touch of the primary segment. In one such example, touch of the primary segment may be operable to start/stop/pause/resume playback of an associated stem and touch of the secondary stems may be operable to vary the volume of the playback of the associated stem.

In such embodiments, the primary segment may be provided at one end of the array of segments. Alternatively, the primary segment may be provided toward the centre of the array of segments. The latter position may better facilitate control of particular stem properties.

The audio output device may comprise one or more additional control inputs. The additional control inputs may take any suitable form. In one embodiment, the additional control inputs comprise push switches. The additional control inputs may be connected to the controller. The controller may be operable to alter operation of the audio output device in response to the additional control inputs.

The additional control inputs may be operable to control aspects of the audio playback overall. For example, the additional control inputs may be operable to control: playback volume; start/stop/pause/resume playback; skip forwards/backwards; loop playback; filter playback or the like. The additional control inputs may, in some embodiments, comprise a main power switch. The main power switch may comprise a push switch. The main power switch may be operable to switch the audio output device on/off as appropriate.

The audio output device may comprise a communication unit operable to enable exchange of data over a data connection. The data connection may be a wired data connection or a wireless data connection. Suitable wireless data connections include but are not limited to WiFi, Bluetooth, 2G, 3G, 4G, 5G or the like. The data connection an enable the audio output device to receive audio data and/or control signals from a linked device.

In some embodiments, the controller may be operable to process touch signals from each stem control input and thereby vary the playback of stems in response to such signals. In such embodiments, the audio input device may comprise a data storage unit for storing data including but not limited to: one or more musical tracks; and/or one or more stems associated with each said track. Tracks and/or stems may be stored in either a compressed or uncompressed format. In some embodiments, an uncompressed format may be akin to a studio master. In additional or alternative embodiments, the controller may be operable to communicate touch signals to a linked device for processing. In such embodiments, the linked device may be operable to process received touch signals to determine variation of stem properties in the audio data in response to said touch signals and thereby output control signals operable to vary playback of said stems. In such embodiments, the controller may be operable to receive processed control signals from said linked device and thereby vary the playback of stems in response to said control signals. The communication may take place via the communication unit. The linked device may comprise a consumer device such as a desktop computer, laptop computer, tablet computer, smartphone or the like.

The audio output device may be provided with a power supply. The power supply may comprise one or more batteries. The batteries may be rechargeable. Additionally or alternatively, the power supply may comprise a power connection. The power connection may be a wired or wireless power connection, as required or as desired.

The audio output device may comprise a housing. The housing may comprise a base and a cap. The base and the cap may have a substantially circular plan form. The base may have an upwardly projecting side wall extending around a substantial part of the perimeter of the base. The cap may have a downwardly projecting side wall extending around a substantial part of the perimeter of the cap. The respective sidewalls of the base and cap may be adapted to fit together. In some embodiments, the respective sidewalls may snap fit together.

A flexible skin may be provided. The flexible skin may be adapted to fit over all or part of the cap and/or base. The flexible skin may be substantially transparent or translucent. The flexible skin may be formed from silicone.

The flexible skin may have embossed or indented patterns. Alternatively, embossed or indented patterns may be formed on the housing which may be visible or otherwise detectable through the skin. The patterns may identify control inputs over which the skin is fitted. In some embodiments, the skin may be indented over the stem control inputs. This helps a user identify the location of the stem control inputs by touch and can improve touch sensitivity of the segments. The thickness of the skin, or at least the thickness of the skin over the stem control inputs, may be selected so as to enable sufficient touch sensitivity through the skin. The surface of the skin, or at least the surface of the skin over the stem control inputs may be adapted to minimise friction with human skin.

The audio output device may additionally be provided with a haptic feedback unit. The haptic feedback unit may comprise a vibrator motor. The haptic feedback unit may be operable in response to the stem control inputs. In particular, this can provide a user with tactile feedback in addition to the visual feedback provided by the illumination units. In some embodiments, the nature of the haptic feedback, for instance the intensity, frequency, duration or mode (constant/intermittent or otherwise) may be varied in response to the particular touch signals output by the stem control units.

A central PCB (printed circuit board) may be mounted to or within the base or the cap, as appropriate. The controller may be mounted on the central PCB. The central PCB may be electrically connected to the stem control inputs and the loudspeaker. Where appropriate, the central PCB may be electrically connected to any additional control inputs, communication unit, haptic feedback unit or power supply provided.

The loudspeaker may be mounted to or within the base. The base may provide one or more apertures through which sound generated by the loudspeakers may exit the housing.

The one or more additional control inputs may be mounted to or within the base. In a preferred embodiment, the one or more additional control inputs are mounted within the sidewalls of the base. Where the additional control inputs comprise a primary power switch, said primary power switch may be mounted to or within the cap. In such embodiments, the primary power switch may be substantially centrally located with respect to the cap.

The stem control inputs may be mounted to or within the cap. In one embodiment, the stem control inputs may be mounted within corresponding openings provided in the cap. In some embodiments, the stem control inputs may extend radially away from the centre of the cap. In such embodiments, the stem control inputs may be evenly spaced around the centre of the cap.

According to a second aspect of the present invention there is provided a stem control input for an audio output device of the type operable to provide audio playback of an audio track comprising one or more stems, the stem control input comprising: multiple touch sensitive stem segments, each stem segment provided with a corresponding illumination element, and wherein each stem segment is operable in response to touch to output a touch signal, the touch signal operable to control: operation of the corresponding illumination element; and audio playback of the stem associated with said stem control input.

The stem control input of the second aspect of the present invention may incorporate any or all features of the audio output device of the first aspect of the present invention as desired or as appropriate.

BRIEF DESCRIPTION OF THE DRAWINGS

In order that the invention may be more clearly understood one or more embodiments thereof will now be described, by way of example only, with reference to the accompanying drawings, of which.

DETAILED DESCRIPTION

Figure 1A:
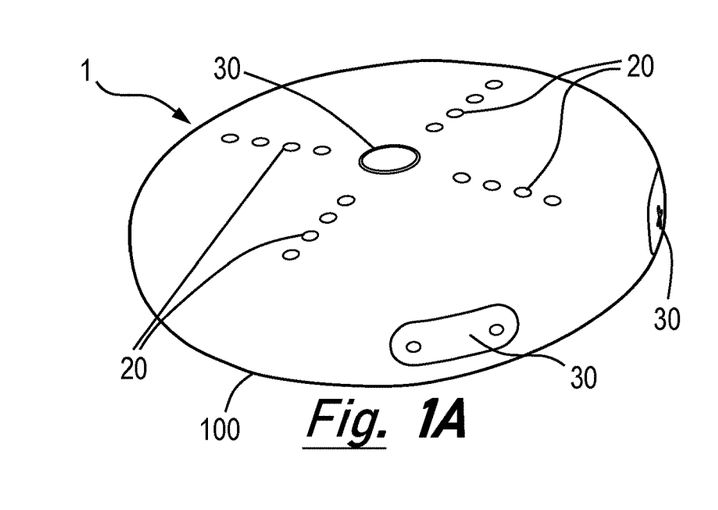
FIG. 1A shows a top view of an audio output device according to the present invention.
Figure 1B:
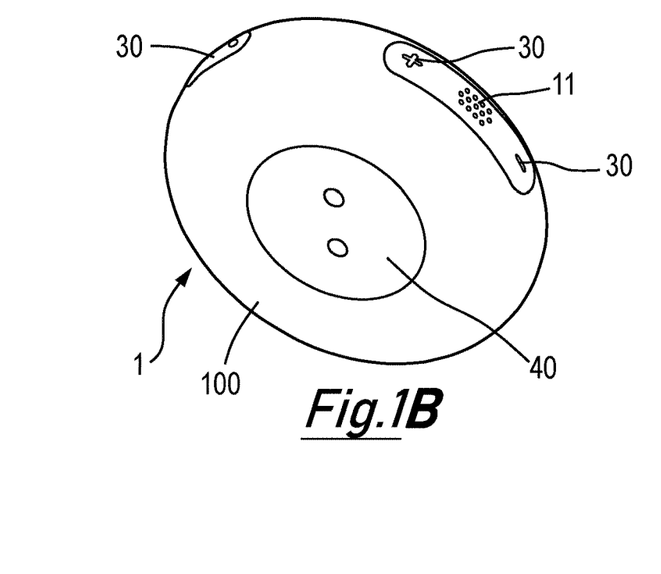
FIG. 1B shows a bottom view of an audio output device of FIG. 1A.
Figure 1C:
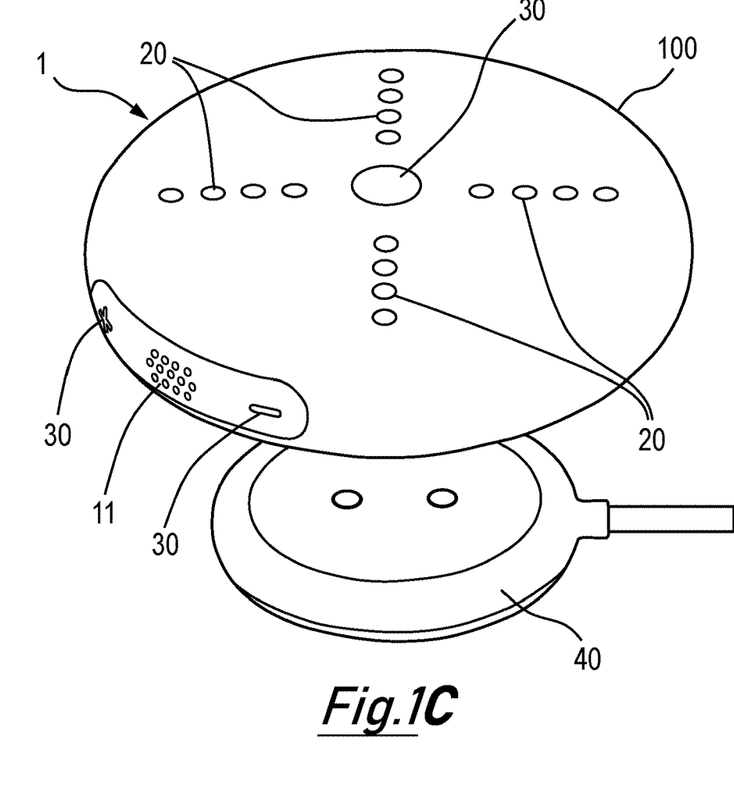
FIG. 1C shows an upper view of an audio output device of FIGS. 1A and 1B invention from a different angle to FIG. 1A, plus a power/data connector for the audio output device.

Turning now to FIGS. 1A to 1C, an audio output device 1 is provided within a housing 100. The audio output device comprises a loudspeaker 10 and, in this example, four stem control inputs 20. The skilled man will appreciate that more or fewer stem control inputs 20 can be provided in alternative embodiments. The stem control inputs 20 illustrated are substantially even spaced on the upper surface of the housing 100, projecting radially away from the centre of the top of the housing 100. The skilled man will appreciate that alternative positional arrangements of the stem control inputs 20 may be possible.

Perforations 11 provided on housing 100 can readily enable vibrations generated by the loudspeaker to reach the exterior of the device 1.

The stem control inputs 20 are each divided into, in this example, four segments 21-24, each segment comprising a touch sensor 25 and an illumination unit 26. The skilled man will appreciate that the stem control inputs 20 can be divided into more or fewer segments 21-24 in alternative embodiments. Each stem control input 20 is associated with a different stem in an audio track for playback via the loudspeaker 10.

In use, touching the segments 21-24 of each stem control input results in the touch being detected and a touch signal being output by the respective segment 21-24. In response to a touch signal, the illumination unit 26 associated with each segment 21-24 is togged on/off. Additionally, a property of the associated stem is varied during playback by loudspeaker 10. Touch sensing ensures that control of stems is straightforward and the toggling of illumination units 26 ensures that a user is readily aware of the current status of each segment 21-24 of each stem control input 20.

As can be seen on FIGS. 1A to 1C, the device 1 may also be provided with additional control inputs 30 in the form of push switches. The additional control inputs 30 may enable other device properties to be controlled such as power on/off, overall audio volume up/down, playback start/stop/pause/resume/skip/loop as appropriate. This allows conventional audio playback to be provided alongside stem playback or for the device 1 to operate as a conventional audio output device when stem playback is not required/desired.

As shown in FIGS. 1A to 1C, the device 1 is also provided with a power/data communication connector 40. This can interface with an external power/data connector 41. The skilled man will appreciate that other forms of wired/wireless power and data connections may be substituted if desired or appropriate. The skilled man will also appreciate that separate dedicated power and data connections can be provided if desired or appropriate. The external connector 41 may be connected in turn to a linked user device such as a smartphone, tablet computer, laptop computer of the like. This can allow a user to supply audio tracks for playback to the device 1 and or to control association of stems to stem control inputs 20, as desired or as appropriate.

Figure 2:
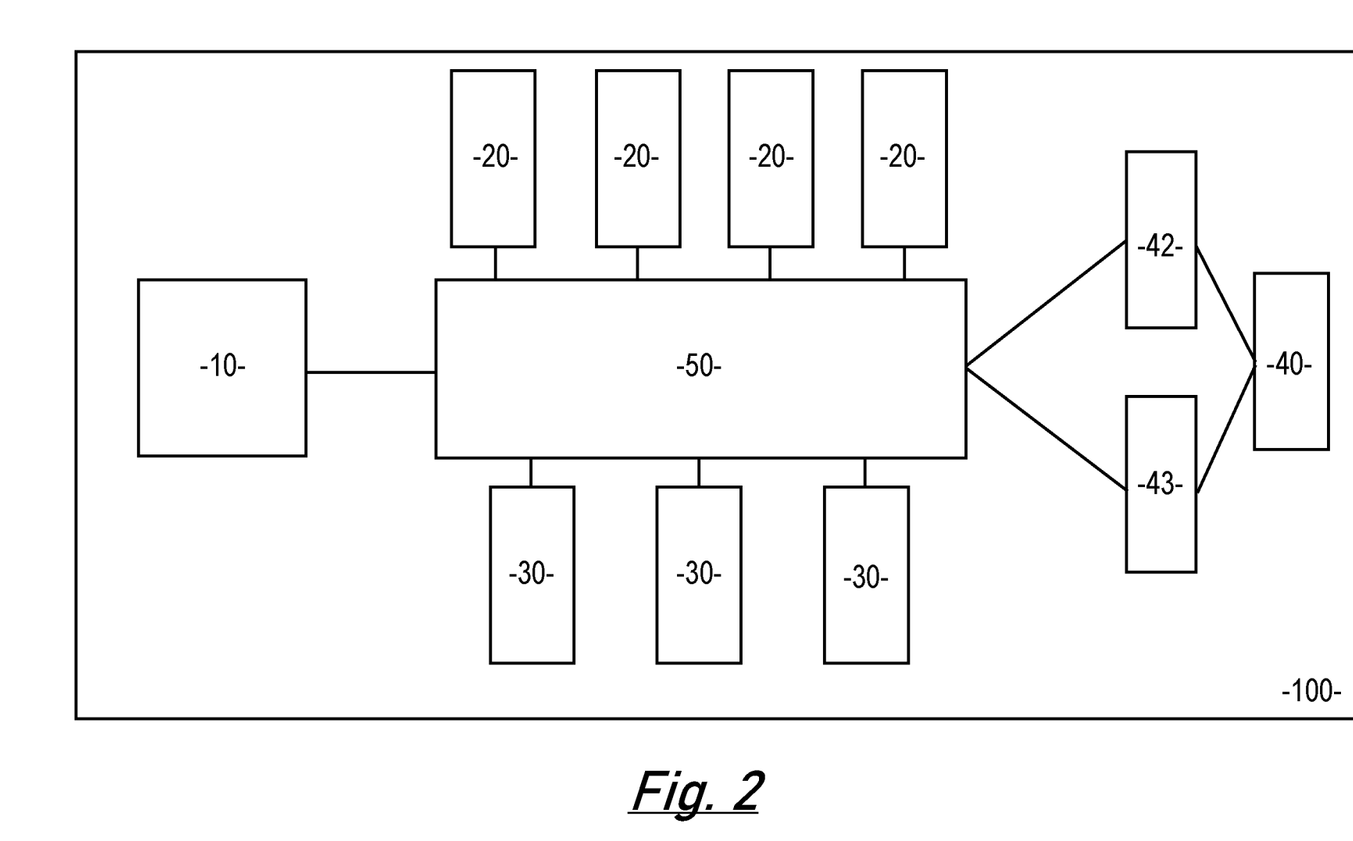
FIG. 2 is a schematic block diagram of the audio output device of FIGS. 1A to 1C.

Turning now to FIG. 2, a schematic block diagram of the device 1 is shown. As shown in FIG. 2, each stem control input 20 and each additional control input 30 are connected to the loudspeaker via a controller 50. Additionally connected to controller 50 are communication unit 42 and power supply unit 43. The communication unit 42 and power supply 43 are in turn connected to power/data connector 40. Optionally, as shown in FIG. 2, the device 1 is provided with a haptic feedback unit 80. The haptic feedback unit may be a vibrator motor and is operable in response to touch signals to output haptic feedback in addition to the visual feedback provided by illumination units 26.

The controller 50 may optionally comprise a processor operable to process all inputs via stem control inputs 20 and each additional control inputs 30 and control the operation of the device 1, in particular playback of through loudspeaker 10 in response. Alternatively, the controller may simply collate and pass on some inputs, such as those from stem control inputs 20 to a linked device via communication unit 42 and connector 40. These inputs can be processed at the linked device and a suitably varied audio signal may be communicated back to the controller for playback via connector 40 and communication unit 42. Similarly, to processing the controller 50 may optionally be provided with a local data store for storing audio data (including audio tracks and stems) for playback. Alternatively, audio data may be primarily stored on a linked device and streamed to the device 1 for playback.

Figure 3A:
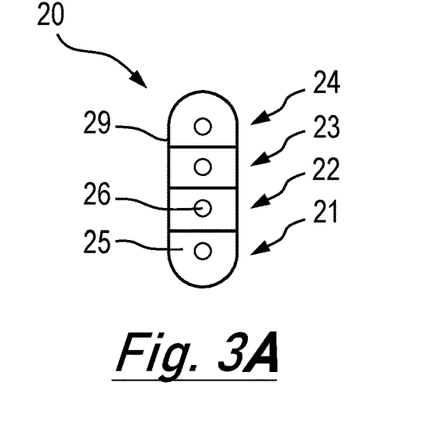
FIG. 3A shows a top side view of a stem control input.
Figure 3B:
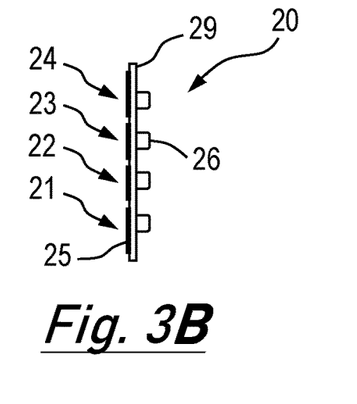
FIG. 3B shows a side view of a stem control input.

Turning now to FIGS. 3A, 3B, 4A, 4B, 4C & 4D, the construction of and operation of stem control inputs 20 is now described in more detail. As shown in FIG. 3a, a stem control input 20 comprises a substrate 29 divided into 4 segments 21-24. On a front surface of each segment 21-24 is formed a capacitive touch sensing circuit 25. On the rear surface of each segment 21-24 is mounted an LED 26, the LED orientated so as to emit light primarily toward the front surface of the substrate 29. If the substrate 29 is not transparent or substantially translucent an aperture may be provided in the substrate to allow light emitted by the LEDs 26 to pass through the substrate 29.

In the example shown in FIGS. 4A to 4D, the control input 20 has a segment designated as a primary segment 21 and the remaining segments 22-24 are designated as secondary segments.

Figure 4A:
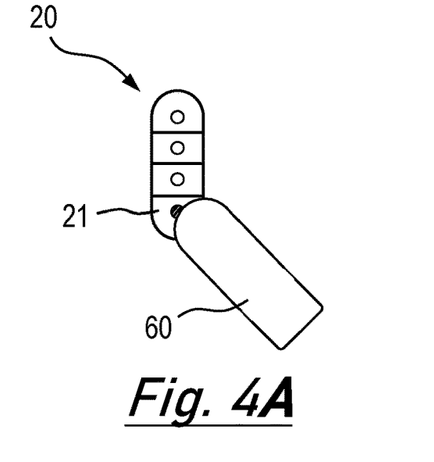
FIG. 4A illustrates a step in the operation of the stem control input of FIGS. 3A and 3B.

As shown in FIG. 4A, a user's finger 60 touches primary segment 21 and is detected by touch sensing circuit 25 for segment 21. Consequently, corresponding LED 26 is activated and playback of an associated stem through loudspeaker 10 is initiated. The activation of LED 26 provides visual feedback to the user to confirm the current status of stem playback.

Figure 4B:
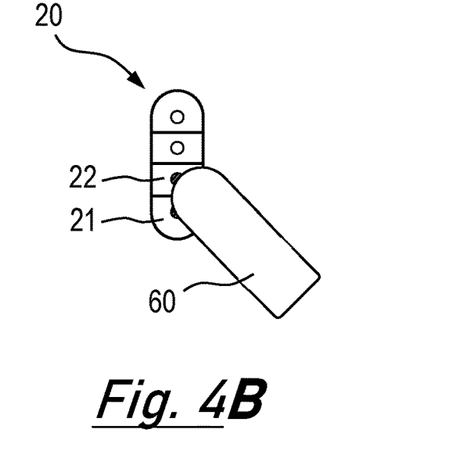
FIG. 4B illustrates another step in the operation of the stem control input of FIGS. 3A and 3B.
Figure 4C:
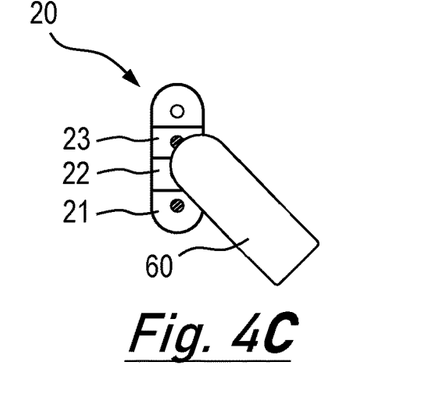
FIG. 4C illustrates a further step in the operation of the stem control input of FIGS. 3A and 3B.
Figure 4D:
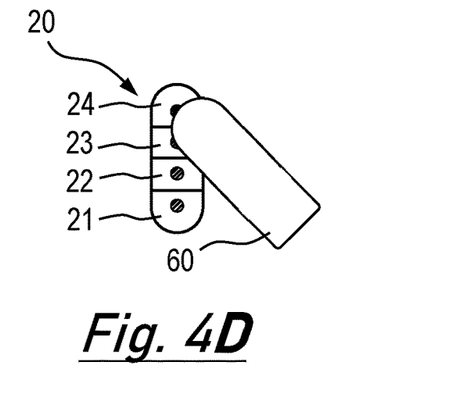
FIG. 4D illustrates a still further step in the operation of the stem control input of FIGS. 3A and 3B.

If finger 60 subsequently touches secondary segment 22, this is detected by touch sensing circuit 25 for segment 22. Consequently, corresponding LED 26 is activated and the volume of stem playback is increased. This is illustrated in FIG. 4B. Similarly, if finger 60 subsequently touches secondary segment 23 or 24, this is detected by the respective touch sensing circuit 25 for the segment 23, 24. Consequently, the corresponding LED 26 is activated and the volume of stem playback is increased further. This is illustrated in FIGS. 4C and 4D.

If segment 23 or 24 is touched before segments 22 or 23 this can result in the LEDs for all segments closer to segment 21 being activated and the stem playback volume being raised directly to eth level associated with the touched segment 23, 24.

Volume of stem playback can subsequently be reduced by touching a secondary segment 22-24 again. This will also result in deactivation of the LED 26 for the touched segment 22-24 and/or for any segments 23-24 further from the primary segment 21. Additionally, stem playback can be stopped/paused by touching segment 21, which would also result in deactivation of the LEDs 26 for all segments 21-24. Subsequent touching segment 21 can resume or restart stem playback, activate the LED 26 for segment 21 and enable stem volume control by touching segments 22-24, as described above. The skilled man will appreciate that if desired or appropriate other stem properties may be controlled using the stem control inputs 20 in a similar manner.

In use, each stem control input 20 can be separately touched to enable independent control of a different stem. This can allow a user to readily and easily create their own unique audio playback experience by varying stem properties.

Figure 5:
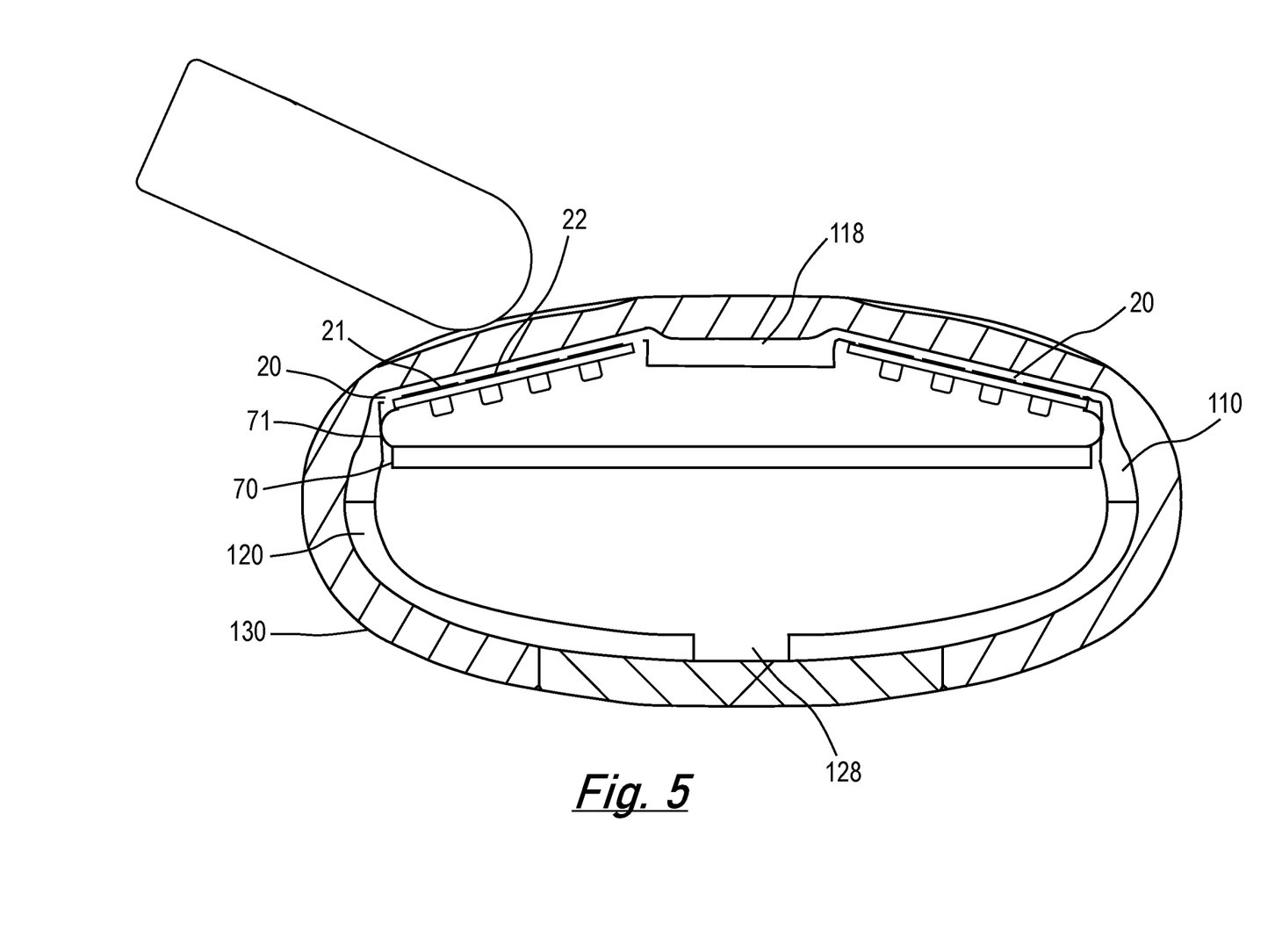
FIG. 5 is a schematic cross-sectional view of the audio output device of FIGS. 1A to 1C.
Figures 6A, 6B:
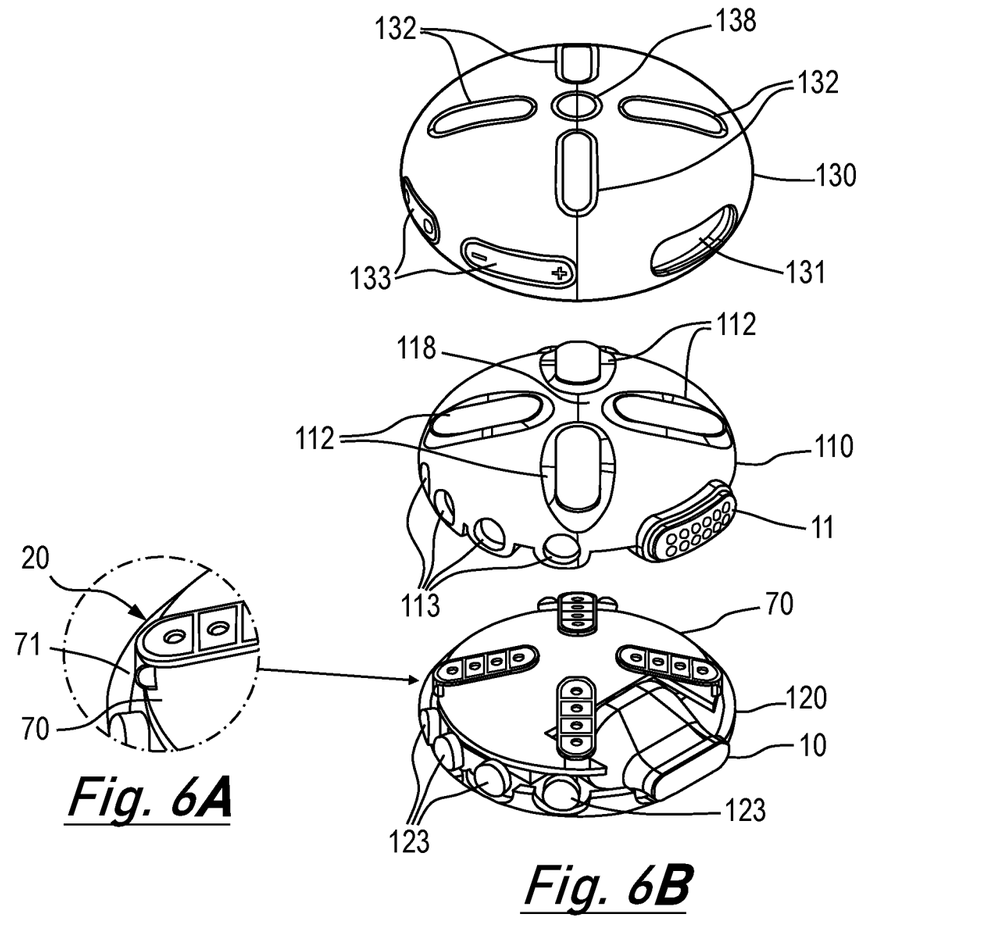
FIG. 6A is an exploded view of the audio output device of FIGS. 1A to 1C.
FIG. 6B is an expanded view of FIG. 6A illustrating electrical connection to the stem control input.

Turning now to FIGS. 5. 6A & 6B, the housing 100 is comprised of an upper cap 110 And a lower base 120. The stem control inputs 20, are mounted to the cap 110. A flexible silicone skin 130 is provided as an outer layer of the housing 100 over at least parts of both cap 110 and base 120. The skin provides protection for the device 1 as a whole as well as specifically protecting the stem control inputs 20. If sufficient pressure is applied to the skin 130 over the stem control input 20, the touch can be detected and stem control operation can proceed as described above. For example, in FIG. 6, touch from finger 60 has been detected on segments 21 and 22 of one of the stem control inputs 20. Accordingly, the corresponding LEDs 26 have been activated.

Whilst the skin 130 can have any decorative coloration desired, at least those portions of the skin 130 lying over control inputs 20 should be transparent or at least substantially translucent to facilitate transmission of lights from LEDs 26.

Also illustrated in FIG. 5 is a main PCB (printed circuit board) 70 upon which controller 50 can be provided. Typically, the communication unit 42 and power supply 43 might also be provided on the main PCB.

The main PCB 80 is electrically connected to the stem control inputs by leads 71. The main PCB 80 can also be connected to the loudspeaker 10, additional control inputs 30 and power/data connection 40 by similar leads (not shown). An aperture 128 within which the power/data connection 40 fits is illustrated in FIG. 5.

Turning to FIGS. 6A & 6B, both cap 110 and base 120 are provided with sidewall 119, 129 respectively. The sidewalls 119, 129 have corresponding configurations such that they can snap fit together. The sidewalls 119, 129 each are also provided with apertures 113, 123 within which additional control inputs 30 in the form of push switches can be mounted. Typically, these might comprise switches dedicated to controlling volume, track selection, play/pause or the like. A further additional control input 30, comprising a push switch toggling device power can be fitted at the upper centre 118 of the cap 110.

The stem control inputs are adapted to be mounted within openings 112 provided in the cap 110. The stem control inputs 120 may be fixed to the openings 112 by adhesive or by a suitable releasable fixing means.

The skin 130 can be provided with embossed or indented portions corresponding to the location of the various stem control inputs 132 or the additional control inputs 133, 138.

The one or more embodiments are described above by way of example only. Many variations are possible without departing from the scope of protection afforded by the appended claims.

The use of the terms "a" and "an" and "the" and "at least one" and similar referents in the context of describing the disclosed subject matter (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or example language (e.g., "such as") provided herein, is intended merely to better illuminate the disclosed subject matter and does not pose a limitation on the scope of the invention unless otherwise claimed. No language in the specification should be construed as indicating any non-claimed element as essential to the practice of the invention.

Certain embodiments are described herein. Variations of those embodiments may become apparent to those of ordinary skill in the art upon reading the foregoing description. The inventors expect skilled artisans to employ such variations as appropriate, and the inventors intend for the embodiments to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

The invention claimed is:

1. An audio output device operable to provide audio playback of an audio track comprising one or more stems, the audio output device comprising:
   a loudspeaker operable to provide audio playback; and
   a plurality of stem control inputs, each stem control input associated with a stem, wherein each stem control input comprises multiple touch sensitive stem segments, each stem segment provided with a corresponding illumination element, and wherein each stem segment is operable in response to touch to output a touch signal, the touch signal operable to control:
   operation of the corresponding illumination element; and
   audio playback of the stem associated with said stem control input.

2. An audio output device as claimed in claim 1 wherein the audio output device comprises a controller connected to the loudspeaker and the stem control inputs, the controller operable to control loudspeaker operation in response to the stem control inputs.

3. An audio output device as claimed in claim 2 wherein the controller is operable to process touch signals from each stem control input and thereby vary the playback of stems in response to such signals.

4. An audio output device as claimed in claim 3 wherein the audio input device comprises a data storage unit for storing data including but not limited to: one or more musical tracks; and/or one or more stems associated with each said track.

5. An audio output device as claimed in claim 2 wherein the controller is operable to communicate touch signals to a linked device for processing.

6. An audio output device as claimed in claim 5 wherein the linked device is operable to process received touch signals to determine variation of stem properties in the audio data in response to said touch signals and thereby output control signals operable to vary playback of said stems and wherein the controller is operable to receive processed control signals from said linked device and thereby vary the playback of stems in response to said control signals.

7. An audio output device as claimed in claim 1 wherein the segments in each stem control input are provided in a linear array.

8. An audio output device as claimed in claim 1 wherein each segment comprises a capacitive touch sensing circuit on a front face of a substrate.

9. An audio output device as claimed in claim 1 wherein the corresponding illumination unit is provided on a rear face of the substrate.

10. An audio output device as claimed in claim 1 wherein the activation status of the corresponding illumination unit is toggled in response to touch of the segment.

11. An audio output device as claimed in claim 1 wherein the substrate is transparent or translucent comprises a transparent or translucent aperture in the vicinity of the illumination unit.

12. An audio output device as claimed in claim 1 wherein in response to touch of a stem control input, playback of the associated stem is started, stopped, paused or resumed, or playback volume of the associated stem, playback speed of the associated stem, looping of all or part of the associated stem, isolation of the associated stem are varied.

13. An audio output device as claimed in claim 1 wherein each stem control input comprises a primary segment and a plurality of secondary segments.

14. An audio output device as claimed in claim 13 wherein touch of the primary segment controls a first stem playback property and touch of the secondary segments controls a secondary playback property.

15. An audio output device as claimed in claim 13 wherein the output of touch signals and/or control of audio playback and/or the corresponding illumination unit are enabled or disabled for secondary segments in response to touch of the primary segment.

16. An audio output device as claimed in claim 13 wherein touch of the primary segment is operable to start/stop/pause/resume playback of an associated stem and touch of the secondary stems is operable to vary the volume of the playback of the associated stem.

17. An audio output device as claimed in claim 13 wherein the primary segment is provided at one end of the array of segments.

18. An audio output device as claimed in claim 1 wherein the audio output device comprises one or more additional control inputs.

19. An audio output device as claimed in claim 18 wherein the additional control inputs are connected to the controller and the controller is operable to alter operation of the audio output device in response to the additional control inputs.

20. An audio output device as claimed in claim 1 wherein the audio output device comprises a housing formed from a base and a cap.

21. An audio output device as claimed in claim 20 wherein the audio output device comprises a flexible skin adapted to fit over all or part of the cap and/or base.

22. An audio output device as claimed in claim 20 wherein the stem control inputs are mounted to or within corresponding openings provided in the cap.

23. An audio output device as claimed in claim 20 wherein the stem control inputs extend radially away from the centre of the cap and are evenly spaced around the centre of the cap.

24. An audio output device as claimed in claim 1 wherein a haptic feedback unit is provided, the haptic feedback unit operable in response to the stem control inputs.

25. A stem control input for an audio output device of the type operable to provide audio playback of an audio track comprising one or more stems, the stem control input comprising: multiple touch sensitive stem segments, each stem segment provided with a corresponding illumination element, and wherein each stem segment is operable in response to touch to output a touch signal, the touch signal operable to control: operation of the corresponding illumination element; and audio playback of the stem associated with said stem control input.

* * * * *